United States Patent
Dai et al.

(10) Patent No.: US 9,876,505 B1
(45) Date of Patent: Jan. 23, 2018

(54) SUPERCONDUCTING ISOCHRONOUS RECEIVER SYSTEM

(71) Applicants: Haitao O. Dai, North Wales, PA (US); Quentin P. Herr, Ellicott City, MD (US); Steven B. Shauck, Crofton, MD (US); Anna Y. Herr, Ellicott City, MD (US); Randall M. Burnett, Catonsville, MD (US)

(72) Inventors: Haitao O. Dai, North Wales, PA (US); Quentin P. Herr, Ellicott City, MD (US); Steven B. Shauck, Crofton, MD (US); Anna Y. Herr, Ellicott City, MD (US); Randall M. Burnett, Catonsville, MD (US)

(73) Assignee: Northrop Grumman Systems Corporation, Falls Church, VA (US)

(*) Notice: Subject to any disclaimer, the term of this patent is extended or adjusted under 35 U.S.C. 154(b) by 0 days.

(21) Appl. No.: 15/256,213

(22) Filed: Sep. 2, 2016

(51) Int. Cl.
*H03K 19/195* (2006.01)
*G06N 99/00* (2010.01)
*H04B 1/40* (2015.01)

(52) U.S. Cl.
CPC ........ *H03K 19/195* (2013.01); *G06N 99/002* (2013.01); *H04B 1/40* (2013.01)

(58) Field of Classification Search
CPC ........................... H03K 19/195; G06N 99/002
USPC ............................................................ 326/4
See application file for complete search history.

(56) References Cited

U.S. PATENT DOCUMENTS

| | | | |
|---|---|---|---|
| 9,281,057 B1 * | 3/2016 | Herr .................. | G11C 11/44 |
| 2016/0013791 A1 * | 1/2016 | Herr .................. | H03K 3/38 |
| | | | 326/5 |
| 2016/0164505 A1 * | 6/2016 | Naaman .............. | H03K 3/38 |
| | | | 327/528 |

* cited by examiner

*Primary Examiner* — Dylan White
(74) *Attorney, Agent, or Firm* — Tarolli, Sundheim, Covell & Tummino LLP

(57) ABSTRACT

An isochronous receiver system is provided and includes a single flux quantum (SFQ) receiver to receive a data signal from a transmission line. The single flux quantum receiver then converts the data signal to an SFQ signal. The system also includes a converter system to convert the SFQ signal to a reciprocal quantum logic (RQL) signal and to phase-align the RQL signal with a sampling phase of an AC clock signal.

20 Claims, 8 Drawing Sheets

SUPERCONDUCTING ISOCHRONOUS RECEIVER SYSTEM

GOVERNMENT INTEREST

The invention was made under Government Contract Number W911NF-14-C-0116. Therefore, the US Government has rights to the invention as specified in that contract.

TECHNICAL FIELD

This disclosure relates generally to classical and quantum computing systems, and more specifically to a superconducting isochronous receiver system.

BACKGROUND

Computer systems typically implement communication between separate chips, separate printed circuit boards, and/or separate computer systems. To properly implement inter-chip or other types of communication (e.g., across a bus), a clock signal can be used to properly time the transmitter and the receiver to appropriately sample the data being transmitted, such that the receiver can properly receive and process the data. However, because the clock signal can be generated from multiple sources, or can be transmitted across the inter-chip communication system, the clock signals that are implemented for transmission and for reception of the data can have an unknown or arbitrary phase relation, which can be referred to as isochronous communication. Certain types of communication, such as certain types of superconducting logic (e.g., reciprocal quantum logic, or RQL) implement the clock signal as a power source, thus precluding the possibility of clock recovery with the associated AC clock signal.

SUMMARY

One example includes an isochronous receiver system. The system includes a single flux quantum (SFQ) receiver configured to receive a data signal from a transmission line and to convert the data signal to an SFQ signal. The system also includes a converter system configured to convert the SFQ signal to a reciprocal quantum logic (RQL) signal and to phase-align the RQL signal with a sampling phase of an AC clock signal.

Another example includes a method for isochronously receiving a data signal from a transmission line. The method includes providing a DC current to an SFQ receiver of a receiver system to convert the data signal to an SFQ signal and splitting the SFQ signal into a plurality of SFQ signals. The method also includes providing an AC clock signal to an SFQ to RQL converter system of the receiver system to convert the plurality of SFQ signals into a respective plurality of RQL phase signals that are associated with a respective plurality of phases of the AC clock signal. The method further includes generating an RQL output signal based on the plurality of RQL phase signals via digital logic to phase-align the RQL output signal to a sampling phase of the AC clock signal.

Another example includes an isochronous superconducting inter-chip transmission system. The system includes a transmitter system configured to convert an RQL input signal into the data signal and a transmission line to transmit the data signal from the transmitter system. The system also includes an isochronous receiver system. The isochronous receiver system includes an SFQ receiver configured to receive the data signal from the transmission line and to convert the data signal to an SFQ signal. The isochronous receiver system also includes a converter system configured to convert the SFQ signal to an RQL signal and to phase-align the RQL signal with a sampling phase of an AC clock signal.

DETAILED DESCRIPTION

This disclosure relates generally to classical and quantum computing systems, and more specifically to a superconducting isochronous data receiver. The superconducting isochronous receiver system can be implemented in a variety of superconducting inter-chip communication systems, such as in a reciprocal quantum logic (RQL) computer system. The superconducting isochronous receiver system includes a single flux quantum (SFQ) receiver configured to receive a data signal from a transmission line and to convert the data signal to an SFQ signal. As an example, the data signal can be generated from a transmission system that is configured to convert an RQL input signal into an SFQ signal, and to convert the SFQ signal into the data signal that is transmitted across the transmission line. The superconducting isochronous receiver system also includes a converter system that is configured to convert the SFQ signal to an RQL signal and to phase-align the RQL signal with a sampling phase of an AC clock signal in response to an alignment signal.

As an example, the converter system can include an SFQ splitter stage that is configured to split the SFQ signal into a plurality of SFQ signals. The SFQ signals can be provided to a respective plurality of SFQ to RQL converters that are provided an AC clock signal to convert the SFQ signals into a plurality of RQL phase signals, with each of the RQL phase signals being associated with a separate respective phase of the AC clock signal (e.g., associated with sequential 90° phases of the AC clock signal). Thus, based on the respective timing of the SFQ signals, an associated RQL pulse can be provided on at least one of the RQL phase signals based on timing windows between respective RQL phases, and can drift from one phase of the AC clock signal to an adjacent phase (ahead or behind). The RQL phase signals can thus be provided to digital logic that is configured to generate an RQL output signal that is aligned with a sampling phase of the AC clock signal based on the RQL phase signals and in response to an alignment signal that is configured to provide a trigger (e.g., to latch an RQL pulse in at least one of the RQL phase signals). Therefore, the RQL output signal can be aligned at a known phase of the AC clock signal to provide the respective data.

Figure 1:
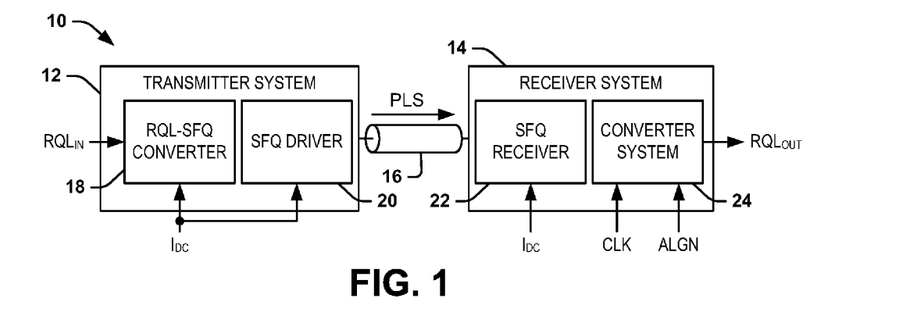
FIG. 1 illustrates an example of an isochronous superconducting inter-chip transmission system.

FIG. 1 illustrates an example of an isochronous superconducting inter-chip transmission system 10. The isochronous superconducting inter-chip transmission system 10 can be implemented in any of a variety of computer systems to provide inter-chip communication in a superconducting data transfer (e.g., in a reciprocal quantum logic (RQL) communication system). The isochronous superconducting inter-chip transmission system 10 can be implemented to provide the inter-chip communication in a manner that can accommodate an unknown or arbitrary phase relation between clock signals associated with transmission and reception of the communicated data.

The isochronous superconducting inter-chip transmission system 10 includes a transmitter system 12 and a receiver system 14 that are separated by a transmission line 16. The transmitter system 12 is configured to receive an RQL input signal, demonstrated in the example of FIG. 1 as a signal $RQL_{IN}$, and to transmit the signal $RQL_{IN}$ as a pulse signal PLS corresponding to a sequence of data pulses across the transmission line 16 to the receiver system 14. The transmitter system 12 includes an RQL-SFQ converter 18 that is configured to convert the RQL input signal $RQL_{IN}$ into a single flux quantum (SFQ) signal. As an example, the RQL-SFQ converter 18 can be configured as a Josephson transmission line (JTL) that provides a DC bias current, demonstrated as a current $I_{DC}$ in the example of FIG. 1, thus allowing a positive fluxon to be transmitted and rejecting the transmission of the corresponding negative fluxon (e.g., anti-fluxon) associated with the RQL input signal RLQIN. As an example, the current $I_{DC}$ can be generated via an inductive network (e.g., an inductive flux-shuttle loop), as opposed to a resistive network, to substantially mitigate power consumption and heat generation. The transmitter system 12 also includes a SFQ driver 20 that is configured to convert the resultant SFQ signal into a pulse signal PLS that is transmitted across the transmission line 16.

Figure 2:
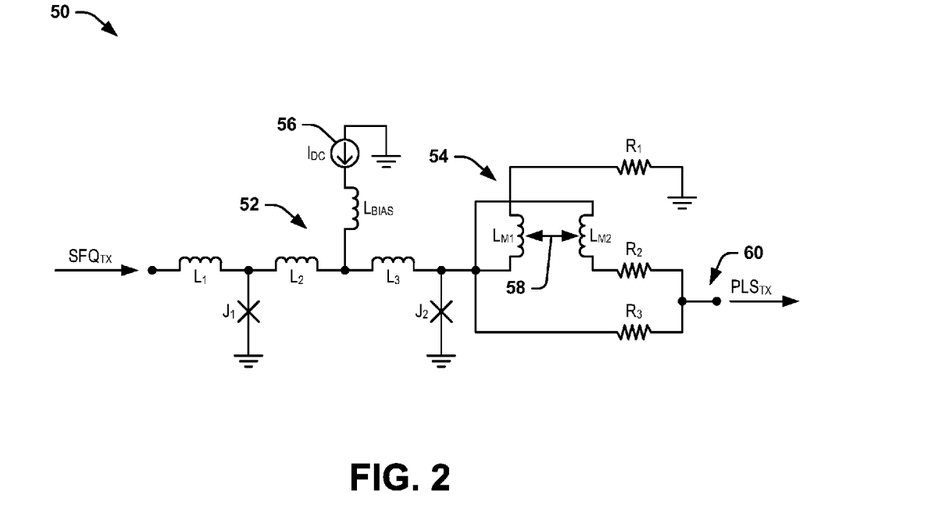
FIG. 2 illustrates an example of an SFQ driver.

FIG. 2 illustrates an example of an SFQ driver 50. The SFQ driver 50 can correspond to the SFQ driver 20 in the example of FIG. 1. The SFQ driver 50 includes a JTL stage 52 that is configured to receive an input SFQ signal, demonstrated in the example of FIG. 2 as a signal $SFQ_{TX}$, that is propagated through the JTL stage 52 to an output driver stage 54. Particularly, the JTL stage 52 includes an input inductor $L_1$ through which the SFQ signal $SFQ_{TX}$ propagates and a first Josephson junction $J_1$ that is triggered in response to an SFQ pulse associated with the SFQ signal $SFQ_{TX}$ based on a DC bias signal $I_{DC}$ generated via a current source 56. The current $I_{DC}$ flows through an inductor $L_{BIAS}$ to bias the first Josephson junction $J_1$ and a second Josephson junction $J_2$ via respective inductors $L_2$ and $L_3$, such that the SFQ signal $SFQ_{TX}$ propagates through the inductors $L_2$ and $L_3$ in response to the first Josephson junction $J_1$ triggering, to subsequently trigger the Josephson junction $J_2$ to provide the SFQ signal $SFQ_{TX}$ to the output driver stage 54.

The output driver stage 54 is configured to convert the SFQ pulse associated with the SFQ signal $SFQ_{TX}$ into a pulse signal for transmission across the transmission line 16 by providing suitable impedance matching. The output driver stage 54 includes a first inductor $L_{M1}$ and a second inductor $L_{M2}$. As an example, the first and second inductors can have a mutual inductance between them, as indicated by an arrow 58 (e.g., k=0.5). The SFQ signal $SFQ_{TX}$ is provided through both the first inductor $L_{M1}$ and the second inductor $L_{M2}$. The portion of the SFQ signal $SFQ_{TX}$ provided through the first inductor $L_{M1}$ is shunted to ground via a resistor $R_1$, and the portion of the SFQ signal $SFQ_{TX}$ provided through the second inductor $L_{M2}$ is provided to an output 60 via a resistor $R_2$. A third portion of the SFQ signal $SFQ_{TX}$ is provided through a resistor $R_3$ to the output 60, thus combining with the second portion of the SFQ signal $SFQ_{TX}$ to generate the pulse signal $PLS_{TX}$ to be transmitted via the transmission line 16 as the pulse signal RX in the example of FIG. 1. The combination of the inductors $L_{M1}$ and $L_{M2}$, and the resistance values of the resistors $R_1$, $R_2$, and $R_3$ can thus provide sufficient impedance matching of the output 60 with the impedance of the transmission line 16 (e.g., approximately 20Ω).

Referring back to the example of FIG. 1, the pulse signal PLS is provided to the receiver system 14. The receiver system 14 includes an SFQ receiver 22 that is configured to convert the received pulse signal PLS back into an SFQ signal. As an example, the SFQ receiver 22 can be configured as a JTL that provides a DC bias current, demonstrated as a current $I_{DC}$ in the example of FIG. 1. The SFQ receiver 22 thus converts the received pulse signal PLS into an SFQ signal based on the triggering of at least one Josephson junction in response to the pulse signal PLS and based on the current $I_{DC}$ (e.g., an under-damped Josephson junction at an input of the SFQ receiver 22 to which the pulse signal PLS is provided). The SFQ signal is thus provided to a converter system 24 that is configured to convert the SFQ signal into an RQL output signal $RQL_{OUT}$ based on an AC clock signal CLK and an alignment signal ALGN, as described in greater detail herein.

As an example, the converter system 24 can be configured to split the SFQ signal into a plurality of SFQ signals, with each of the SFQ signals being provided to a respective plurality of SFQ to RQL converters that are configured to convert the SFQ signals into a plurality of RQL phase signals based on the AC clock signal CLK. Thus, each of the RQL phase signals can be associated with a separate respective phase of the AC clock signal (e.g., associated with sequential 90° phases of the AC clock signal). Therefore, based on the respective timing of the SFQ signals, the SFQ pulse can be provided on at least one of the RQL phase signals based on timing windows between respective RQL phases, and can drift from one phase of the AC clock signal to an adjacent phase (ahead or behind). The converter system 24 can thus implement digital logic operations on the RQL phase signals to generate the RQL output signal $RQL_{OUT}$ that is aligned with a sampling phase of the AC clock signal CLK based on the RQL phase signals and in response to the alignment signal ALGN. Therefore, the RQL output signal $RQL_{OUT}$ can be aligned at a known phase of the AC clock signal CLK. As a result, the receiver system 14 can accommodate an unknown and/or arbitrary phase relationship between a clock signal associated with the RQL input signal $RQL_{IN}$ and the RQL output signal $RQL_{OUT}$, such as based on time varying skew in an associated clock distribution circuit, dynamic changes in loading on the clock, and/or thermal noise.

Figure 3:
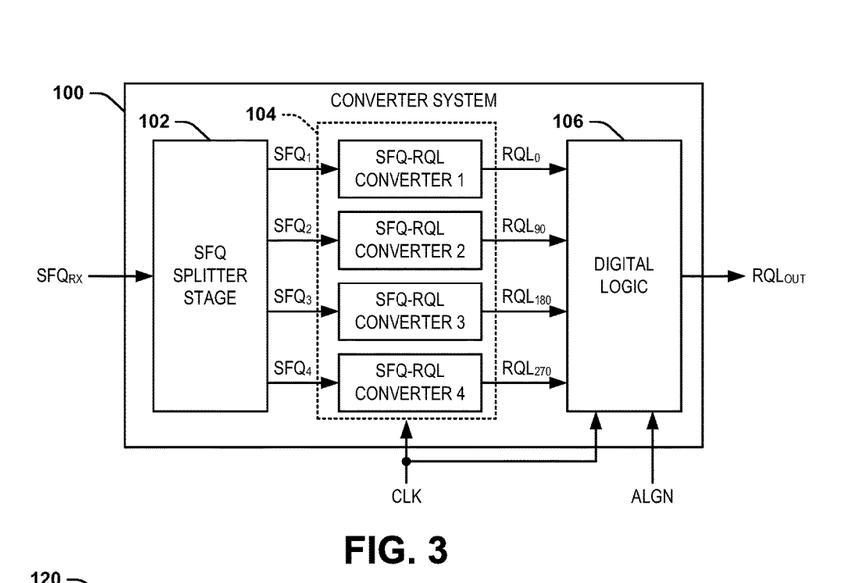
FIG. 3 illustrates an example of a converter system.

FIG. 3 illustrates an example of a converter system 100. The converter system 100 can correspond to the converter system 24 in the example of FIG. 1, and can thus be configured to convert an SFQ signal $SFQ_{RX}$, such as associated with the pulse signal PLS received from the transmission line 16, into an RQL output signal $RQL_{OUT}$.

The converter system 100 includes an SFQ splitter stage 102 that is configured to split the SFQ signal $SFQ_{RX}$ into a plurality of SFQ signals, demonstrated in the example of FIG. 3 as $SFQ_1$, $SFQ_2$, $SFQ_3$, and $SFQ_4$. The number of SFQ signals, four in the example of FIG. 3, can correspond to a number of sampling times in a given period of the AC clock signal CLK. For example, the AC clock signal CLK can be a quadrature clock signal that includes an in-phase component and a quadrature-phase component that are out-of-phase by 90°, and thus provide four separate sample times at each 90° increment of a given period. Each of the SFQ signals $SFQ_1$, $SFQ_2$, $SFQ_3$, and $SFQ_4$ is provided to a separate respective SFQ-RQL converter 104. Each of the SFQ-RQL converters 104 can be provided with a respective inductive coupling to the AC clock signal CLK that corresponds to a specific respective one of the phases.

In the example of FIG. 3, the first of the SFQ-RQL converters 104 can be associated with the 0° phase of the period of the AC clock signal CLK, and the second of the SFQ-RQL converters 104 can be associated with the 90° phase of the period of the AC clock signal CLK. Similarly, the third of the SFQ-RQL converters 104 can be associated with the 180° phase of the period of the AC clock signal CLK, and the fourth of the SFQ-RQL converters 104 can be associated with the 270° phase of the period of the AC clock signal CLK. Therefore, each of the SFQ-RQL converters 104 is configured to generate an RQL phase signal, demonstrated in the example of FIG. 3 as $RQL_0$, $RQL_{90}$, $RQL_{180}$, and $RQL_{270}$, respectively. Thus, each of the RQL phase signals $RQL_0$, $RQL_{90}$, $RQL_{180}$, and $RQL_{270}$ can thus either include an associated fluxon (e.g., and subsequent anti-fluxon) or not, depending on the timing of the arrival of the respective SFQ signals $SFQ_1$, $SFQ_2$, $SFQ_3$, and $SFQ_4$ relative to the sampling time phases of the AC clock signal CLK. For example, if the SFQ signals $SFQ_1$, $SFQ_2$, $SFQ_3$, and $SFQ_4$ have associated SFQ pulses at approximately 120° with respect to a given period of the AC clock signal RQL, the RQL phase signals $RQL_{90}$ and $RQL_{180}$ can each include a fluxon/anti-fluxon pair. Accordingly, at least one of the RQL phase signals $RQL_0$, $RQL_{90}$, $RQL_{180}$, and $RQL_{270}$ can include a fluxon/anti-fluxon pair corresponding to an SFQ pulse associated with the SFQ signal $SFQ_{RX}$.

As an example, the sinusoidal AC clock CLK can have a positive amplitude for approximately 180 degrees. For example, depending on various fabrication factors and design requirements, the converter system 100 can accept an input pulse of the SFQ signal $SFQ_{RX}$ for a subset of these 180°, typically about 120°. The amount of overlap between two of the SFQ-RQL converters 104 that are spaced apart by 90° degrees can depend on a number of factors, including how close the AC clock signal CLK comes to the actual desired spacing in degrees, thermal noise, and how wide the receiver window is. Therefore, the SFQ-RQL converters 104 can be designed to have some amount of overlap, as described previously with respect to the timing of the arrival of the respective SFQ signals $SFQ_1$, $SFQ_2$, $SFQ_3$, and $SFQ_4$ relative to the sampling time phases of the AC clock signal CLK. Otherwise, it is possible that none of the SFQ-RQL converters 104 will sample the SFQ signals $SFQ_1$, $SFQ_2$, $SFQ_3$, and $SFQ_4$, such that the RQL output signal $RQL_{OUT}$ will not be recovered. However, as described previously, the SFQ signals $SFQ_1$, $SFQ_2$, $SFQ_3$, and $SFQ_4$ can be sampled in more than one of the SFQ-RQL converters 104 to provide the RQL phase signals $RQL_0$, $RQL_{90}$, $RQL_{180}$, and $RQL_{270}$ based on the relative time of arrival of the SFQ signals $SFQ_1$, $SFQ_2$, $SFQ_3$, and $SFQ_4$. For example, if the maximum number of the SFQ-RQL converters 104 that can detect a respective one of the SFQ signals $SFQ_1$, $SFQ_2$, $SFQ_3$, and $SFQ_4$ is defined as a variable "MAX", then a variable "M" can be set as follows:

$$M = MAX - 1 \quad \text{Equation 1}$$

Typically M=1, so that an SFQ pulse associated with the SFQ signals $SFQ_1$, $SFQ_2$, $SFQ_3$, and $SFQ_4$ is received by one or two of the SFQ-RQL converters 104, depending on the timing of arrival of the SFQ signals $SFQ_1$, $SFQ_2$, $SFQ_3$, and $SFQ_4$. However, for an oversampling factor of a period of the AC clock signal CLK that is greater than four, M can have a value greater than one.

Figure 4:
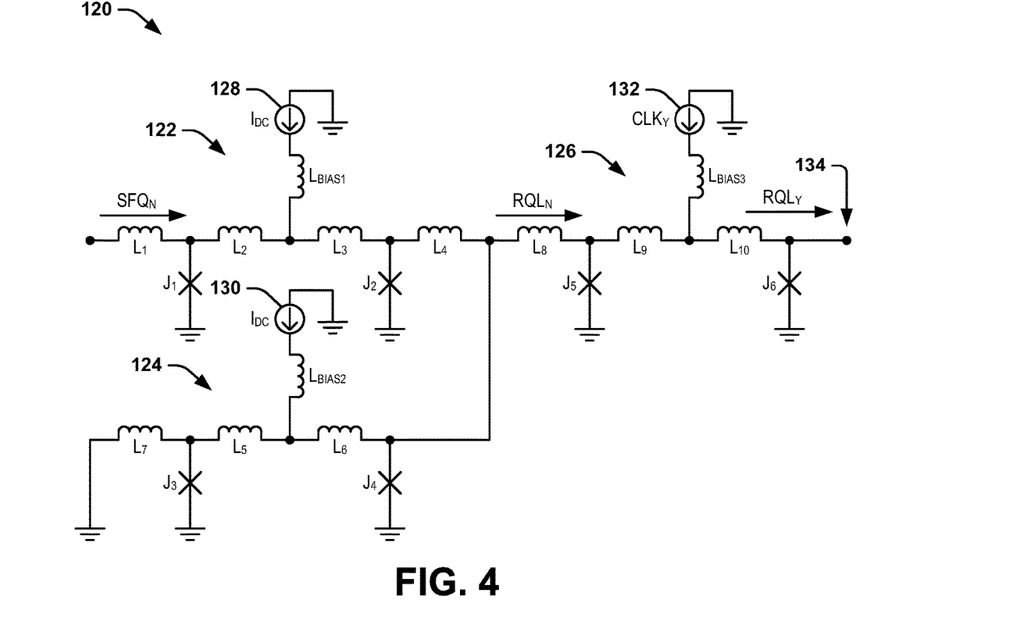
FIG. 4 illustrates an example of an SFQ-RQL converter.

FIG. 4 illustrates an example of an SFQ-RQL converter 120. The SFQ-RQL converter 120 can correspond to any one of the SFQ-RQL converters 104 in the example of FIG. 3, and can thus be configured to generate an RQL phase signal that either has a fluxon/anti-fluxon pair or not depending on a relative timing between the arrival of an input SFQ signal SFQN corresponding to a respective one of the SFQ signals $SFQ_1$, $SFQ_2$, $SFQ_3$, and $SFQ_4$ and the respective sampling phase of the AC clock signal CLK (e.g., 0°, 90°, 180°, and 270°, respectively).

The SFQ-RQL converter 120 includes a first input JTL stage 122 and a second input JTL stage 124. The first input JTL stage 122 is configured to receive the input SFQ pulse SFQN and propagate the input SFQ pulse SFQN to an output JTL stage 126. The first input JTL stage 122 includes an input inductor $L_1$ through which the SFQ pulse SFQN propagates and a first Josephson junction $J_1$ that is triggered in response to the SFQ pulse SFQN based on a DC bias signal $I_{DC}$ generated via a current source 128. The current $I_{DC}$ flows through a first bias inductor $L_{BIAS1}$ to bias the first Josephson junction $J_1$ and a second Josephson junction $J_2$ via respective inductors $L_2$ and $L_3$, such that the SFQ pulse SFQN propagates through the inductors $L_2$ and $L_3$ in response to the first Josephson junction $J_1$ triggering, to subsequently trigger the Josephson junction $J_2$ to provide the SFQ pulse SFQN to the output driver stage 126 via an inductor $L_4$.

The second input JTL stage 124 is configured substantially similarly with respect to the first input JTL stage 122. Particularly, the second input JTL stage 124 includes a pair of Josephson junctions $J_3$ and $J_4$ that are arranged opposite each other with respect to a DC bias current $I_{DC}$ generated via a current source 130 (e.g., from the same current source 128) through a second bias inductor $L_{BIAS2}$ and through inductors $L_5$ and $L_6$. However, the second input JTL stage 124 also includes an inductor $L_7$ that is coupled to ground, such that the second input JTL stage 124 generates an anti-fluxon in response to the fluxon corresponding to the SFQ pulse SFQN. Therefore, in response to the SFQ pulse SFQN being provided at the first input JTL stage 122, the second input JTL stage 124 generates a corresponding anti-fluxon to provide an RQL signal $RQL_N$ at the output JTL stage 126.

The output JTL stage 126 is arranged substantially similar to the first and second input JTL stages 122 and 124. The output JTL stage 126 includes an input inductor $L_8$ through which the RQL signal $RQL_N$ propagates, as well as a pair of Josephson junctions $J_5$ and $J_6$ that are arranged opposite each other with respect to a bias current source 132 and respective inductors $L_9$ and $L_{10}$. However, the bias current source 132 is configured as an AC current source that is associated with a particular respective sampling phase associated with the AC clock signal CLK. In the example of FIG. 4, the AC current is demonstrated as a signal CLK that is provided through a bias inductor $L_{BIAS3}$, where Y corresponds to a given one of the sampling phases of the AC clock signal CLK (e.g., 0°, 90°, 180°, and 270°, respectively). Therefore, if the RQL signal $RQL_N$ arrives in approximately time alignment with the respective phase of the AC clock signal $CLK_Y$ (e.g., based on providing magnetic energy in the inductors $L_8$ and $L_9$), the RQL signal $RQL_N$ will be propagated to an output 134 of the output JTL stage 126 as an RQL output signal RQLY via triggering of the Josephson junctions $J_5$ and $J_6$, where Y corresponds to the respective phase of the AC clock signal $CLK_Y$. However, if the arrival of the RQL signal $RQL_N$ is misaligned with respect to the phase of the AC clock signal $CLK_Y$, the RQL signal $RQL_N$ will be reflected from the output 134 of the output JTL stage 126. As a result, no RQL pulse will be provided from the output 134 of the output JTL stage 126 (e.g., the RQL signal RQLY will be zero volts).

Referring back to the example of FIG. 3, the RQL phase signals $RQL_0$, $RQL_{90}$, $RQL_{180}$, and $RQL_{270}$ are provided to digital logic 106 that is configured to align the RQL pulse associated with the one or more of the RQL phase signals $RQL_0$, $RQL_{90}$, $RQL_{180}$, and $RQL_{270}$ to a predetermined sampling phase of the RQL clock signal CLK to generate the RQL output signal $RQL_{OUT}$. As an example, the digital logic 106 is configured to phase-align and delay each of the plurality of RQL phase signals $RQL_0$, $RQL_{90}$, $RQL_{180}$, and $RQL_{270}$ and to generate at least one trigger signal in response to the alignment signal ALGN and at least one RQL pulse associated with a respective at least one of the respective RQL phase signals $RQL_0$, $RQL_{90}$, $RQL_{180}$, and $RQL_{270}$. The digital logic 106 can also be configured to latch the at least one RQL pulse associated with the phase-aligned and delayed RQL phase signals $RQL_0$, $RQL_{90}$, $RQL_{180}$, and $RQL_{270}$ in response to the at least one trigger signal, and can align the at least one RQL pulse to the sampling phase of the AC clock signal CLK to provide the RQL output signal $RQL_{OUT}$.

Figure 5:
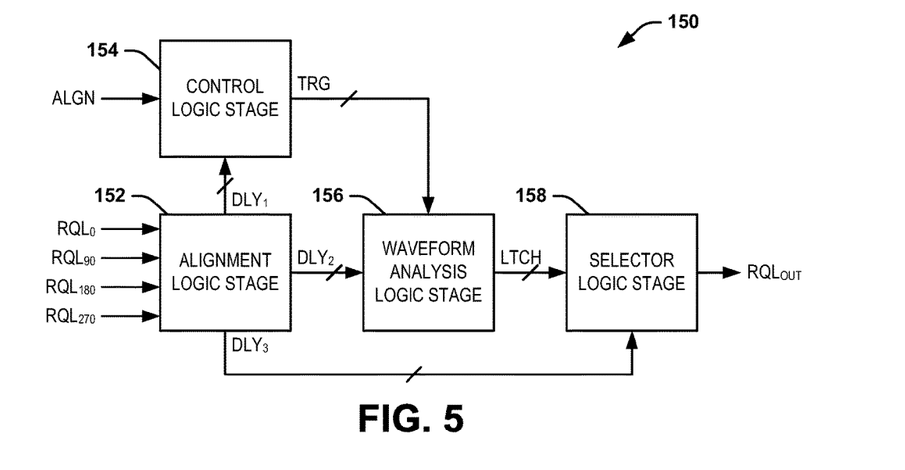
FIG. 5 illustrates an example diagram of digital logic.

FIG. 5 illustrates an example diagram 150 of digital logic. The diagram 150 can demonstrate a more detailed version of the digital logic 106 in the example of FIG. 3. Particularly, the diagram 150 demonstrates multiple stages of the digital logic 106, and a sequence of the digital logic operations that are conducted on the RQL phase signals $RQL_0$, $RQL_{90}$, $RQL_{180}$, and $RQL_{270}$ to generate the RQL output signal $RQL_{OUT}$. As an example, the stages of the digital logic 106 described herein can be clocked by the AC clock signal CLK, and can be based on sequences of JTLs that operate at separate respective phases of the AC clock signal CLK. Additionally, the digital logic 106, as described herein, including the digital logic operations, can be implemented based on RQL digital logic gates that can likewise be clocked by the AC clock signal CLK.

The diagram 150 demonstrates an alignment logic stage 152 that is configured to receive the RQL phase signals $RQL_0$, $RQL_{90}$, $RQL_{180}$, and $RQL_{270}$ and to provide phase alignment of the RQL phase signals $RQL_0$, $RQL_{90}$, $RQL_{180}$, and $RQL_{270}$. Therefore, each of the RQL phase signals $RQL_0$, $RQL_{90}$, $RQL_{180}$, and $RQL_{270}$ can be concurrently clocked by a common phase of the AC clock signal CLK. Therefore, each of the RQL phase signals $RQL_0$, $RQL_{90}$, $RQL_{180}$, and $RQL_{270}$ are aligned to the same phase at a given time. For example, the four phase-consecutive RQL samples provided by the RQL phase signals $RQL_0$, $RQL_{90}$, $RQL_{180}$, and $RQL_{270}$ are presented on phases associated with 0°, 90°, 180°, and 270° degree phases of a period of the AC clock signal CLK, where 0° represents the sample taken earliest in time, 90° is the sample taken 90° degrees later, up to 270° corresponding to the last sample taken in the period of the AC clock signal CLK. As an example, the phase-alignment and delay of the RQL phase signals $RQL_0$, $RQL_{90}$, $RQL_{180}$, and $RQL_{270}$ can be performed by each of a plurality of delay paths that each includes a sequence of clocked JTL delay elements. Thus, the JTL delay elements of the alignment logic stage 152 can be added to each of the RQL phase signals $RQL_0$, $RQL_{90}$, $RQL_{180}$, and $RQL_{270}$ to align all of the RQL phase signals $RQL_0$, $RQL_{90}$, $RQL_{180}$, and $RQL_{270}$ to the 270° phase, as an example. Therefore, each of the RQL phase signals $RQL_0$, $RQL_{90}$, $RQL_{180}$, and $RQL_{270}$ are aligned on the same phase of the AC clock signal CLK at a given time, even though each of the RQL phase signals $RQL_0$, $RQL_{90}$, $RQL_{180}$, and $RQL_{270}$ are associated with a different sampling time of the respective SFQ signals $SFQ_1$, $SFQ_2$, $SFQ_3$, and $SFQ_4$.

Additionally, for example, the alignment logic stage 152 can include a plurality of delay paths that is greater than the number of RQL phase signals, and thus greater than four in the example of FIG. 5. Therefore, the alignment logic stage 152 can be configured to generate one or more additional copies of the RQL phase signals $RQL_0$, $RQL_{90}$, $RQL_{180}$, and $RQL_{270}$ that are likewise phase-aligned with the RQL phase signals $RQL_0$, $RQL_{90}$, $RQL_{180}$, and $RQL_{270}$. As an example, a copy of at least one of the RQL phase signals $RQL_0$, $RQL_{90}$, $RQL_{180}$, and $RQL_{270}$ can be generated by starting with the RQL phase signal $RQL_{270}$ and adding a full period of the AC clock signal CLK of delay to the RQL phase signal $RQL_{270}$ (e.g., based on four additional delay JTLs). Thus, by splitting each of at least one of the plurality of RQL phase signals $RQL_0$, $RQL_{90}$, $RQL_{180}$, and $RQL_{270}$ into more than one of the plurality of delay paths, the digital logic 106 can provide phase-alignment of the RQL output signal $RQL_{OUT}$ based on misalignment of the timing of the SFQ signals $SFQ_1$, $SFQ_2$, $SFQ_3$, and $SFQ_4$ with respect to a single one of the RQL phase signals $RQL_0$, $RQL_{90}$, $RQL_{180}$, and $RQL_{270}$. Thus, the digital logic 106 can provide alignment when a single bit is associated with multiple consecutive ones of the RQL phase signals $RQL_0$, $RQL_{90}$, $RQL_{180}$, and $RQL_{270}$, or drift of the timing of a given one of the RQL phase signals $RQL_0$, $RQL_{90}$, $RQL_{180}$, and $RQL_{270}$ to one of a next or previous one of the plurality of delay paths that are sequential in phase relationship with respect to the AC clock signal CLK (e.g., drifting from the 90° phase to the 180°, etc.).

Table 1 below provides an example of a pattern to create additional delayed copies of the RQL phase signals $RQL_0$, $RQL_{90}$, $RQL_{180}$, and $RQL_{270}$. In Table 1, a number is assigned to each delayed copy. Sample number 1 is the last sample that was taken, and sample number 4 was taken 270° before that. Sample number 5 corresponds to sample number 1 with a full period of the AC clock signal CLK of delay, and is thus taken 360° before the current sample number 1. Therefore, in Table 1, each higher sample number is taken 90° before the current one.

TABLE 1

| Sample Number | Phase | 90 degree delays |
|---|---|---|
| 1 | 270 | 0 |
| 2 | 180 | 1 |
| 3 | 90 | 2 |
| 4 | 0 | 3 |
| 5 | 270 | 4 |
| 6 | 180 | 5 |
| Increment by 1 | (Subtract 90) mod 360 | Increment by 1 |

In addition, the alignment logic stage 152 can be configured to implement phase delays of the aligned RQL phase signals $RQL_0$, $RQL_{90}$, $RQL_{180}$, and $RQL_{270}$, and can provide separate sets of the delayed RQL phase signals $RQL_0$, $RQL_{90}$, $RQL_{180}$, and $RQL_{270}$ to different portions of the digital logic 106. In the example of FIG. 5, the delayed sets of the RQL phase signals $RQL_0$, $RQL_{90}$, $RQL_{180}$, and $RQL_{270}$ are demonstrated as $DLY_1$, $DLY_2$, and $DLY_3$.

The diagram 150 also demonstrates a control logic stage 154 that is configured to receive a first delayed set of the RQL phase signals $DLY_1$. The control logic stage 154 is configured to also receive the alignment signal ALGN. Therefore, the control logic stage 154 is configured to generate at least one trigger signal TRG based on the first delayed set of the RQL phase signals $DLY_1$ and the alignment signal ALGN. As an example, the digital logic 106 can be aligned/calibrated in a number of ways based on receiving the alignment signal ALGN, such as at power-up of the receiver system 14. As another example, if there is a slow change in the skew of the AC clock signal CLK, the receiver system 14 can perform periodic calibrations. For example, the digital logic 106 can be calibrated based on the transmitter system 12 being commanded to stop sending data, and to instead begin sending all logic-zeroes. The alignment signal ALGN can then be pulsed, and the transmitter system 12 can be commanded to send a single one data bit (e.g., a training pulse) followed by at least one more zero.

As an example, in response to receiving the alignment signal ALGN, the control logic stage 154 can monitor NK consecutive samples of the first delayed set of the RQL phase signals $DLY_1$, where N is an oversampling rate and K is a number of periods of the AC clock signal CLK encapsulating a single bit of data (e.g., N=4 and K=1). Since the transmitter system 12 transmits a data bit every K clock periods and the data is sampled N times per clock period, the monitoring window of the control logic stage 154 can be wide enough to guarantee that the training pulse will appear in at least one sample that is provided to the control logic stage 154. As an example, the control logic stage 154 can provide a logic-OR of the NK bits, and in response to the output of the logic-OR being a logic-1, then the alignment signal ALGN corresponds to the correct timing window to perform the calibration. The control logic stage 154 can provide the trigger signal(s) TRG in response to determined correct timing window.

The diagram also demonstrates a waveform analysis logic stage 156 that receives the second delayed set of the RQL phase signals $DLY_2$ and the trigger signal(s) TRG. The waveform analysis logic stage 156 can be configured to latch the logic states of the second delayed set of the RQL phase signals $DLY_2$ in response to the trigger signal(s) TRG. The waveform analysis logic stage 156 thus determines which of the phase-aligned RQL phase signals $RQL_0$, $RQL_{90}$, $RQL_{180}$, and $RQL_{270}$ to include in the RQL output signal $RQL_{OUT}$ for a single bit time. As an example, the second delayed set of the RQL phase signals $DLY_2$ can be approximately the same as the first delayed set of the RQL phase signals $DLY_1$ plus M additional delayed RQL phase signals that can have smaller sample numbers and can correspond to samples later in time. Thus, NK+M consecutive samples can be provided to the waveform analysis logic stage 156 to latch between 1 and M+1 consecutive samples in response to the trigger signal(s) TRG, such as provided to digital latch circuits. Additionally, depending upon performance goals, the waveform analysis logic stage 156 can widen the sampling window by adding additional samples on either or both sides of the period of the AC clock signal CLK and/or based on the number of consecutive logic-1 values it receives. Accordingly, the waveform analysis logic stage 156 stores the window of samples to analyze.

The diagram 150 also demonstrates a selector logic stage 158 that is configured to receive a third delayed set of the RQL phase signals $DLY_3$ and the latched logic values of the RQL phase signals $RQL_0$, $RQL_{90}$, $RQL_{180}$, and $RQL_{270}$. The selector logic stage 158 can include a set of selector logic gates that are configured to provide sequential logic operations on the at least one latched RQL phase signal from the waveform analysis logic stage 156 and the third delayed set of the RQL phase signals $DLY_3$ to generate the RQL output signal $RQL_{OUT}$ that is aligned to the sampling phase of the AC clock signal CLK. As an example, the third delayed set of the RQL phase signals $DLY_3$ can be between NK+M consecutive samples and 2NK-M consecutive samples. As an example, the selector logic stage 158 can continuously perform logic-AND operations on the third delayed set of the RQL phase signals $DLY_3$ with the window from the latched RQL phase signals $RQL_0$, $RQL_{90}$, $RQL_{180}$, and $RQL_{270}$ from the waveform analysis logic stage 156. The selector logic stage 158 can thus perform a logic-OR operation on the outputs of the respective AND-gates to produce a single data output that is aligned with a given one phase of the AC clock signal CLK. Accordingly, the single data output corresponding to the RQL output signal $RQL_{OUT}$ can be a perfect reproduction of the RQL input signal $RQL_{IN}$ provided to the transmitter system 12 with a non-varying delay. Accordingly, additional RQL circuitry that is downstream of the receiver system 14 can essentially treat the RQL data provided as the RQL output signal $RQL_{OUT}$ as a synchronous copy of what was sent by the transmitter system 12.

Figure 6:
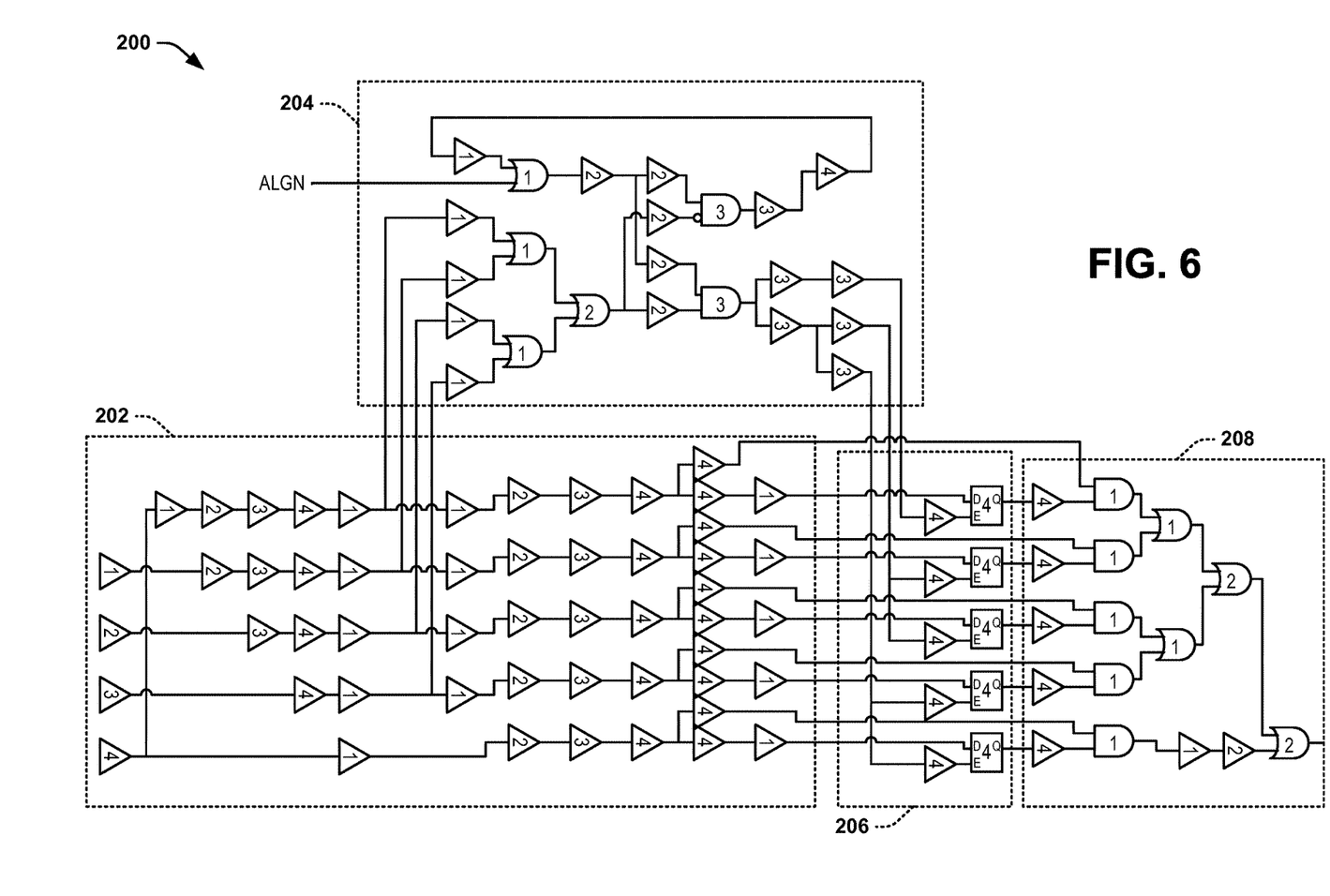
FIG. 6 illustrates an example of digital logic.
Figure 7:
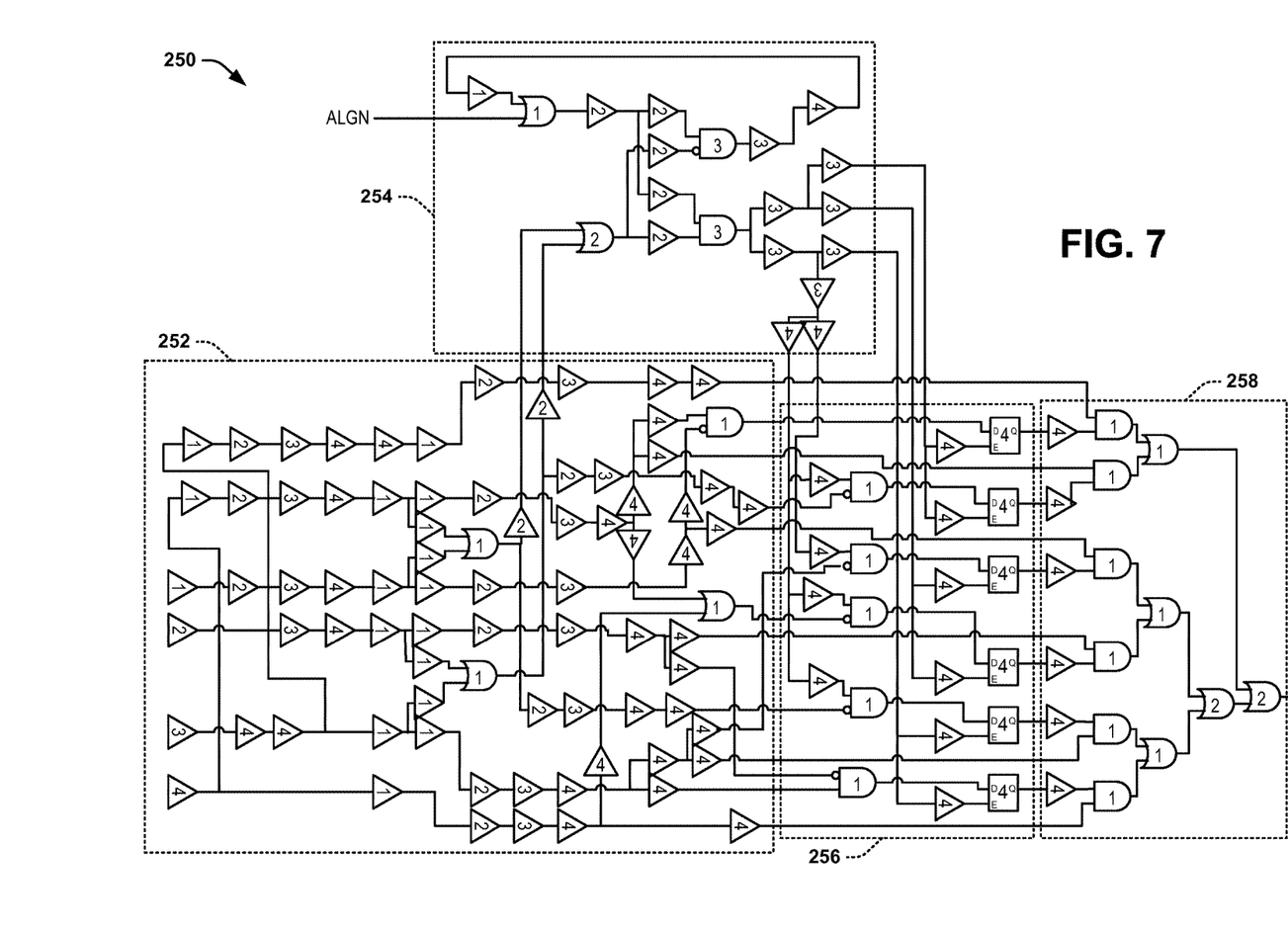
FIG. 7 illustrates another example of digital logic.
Figure 8:
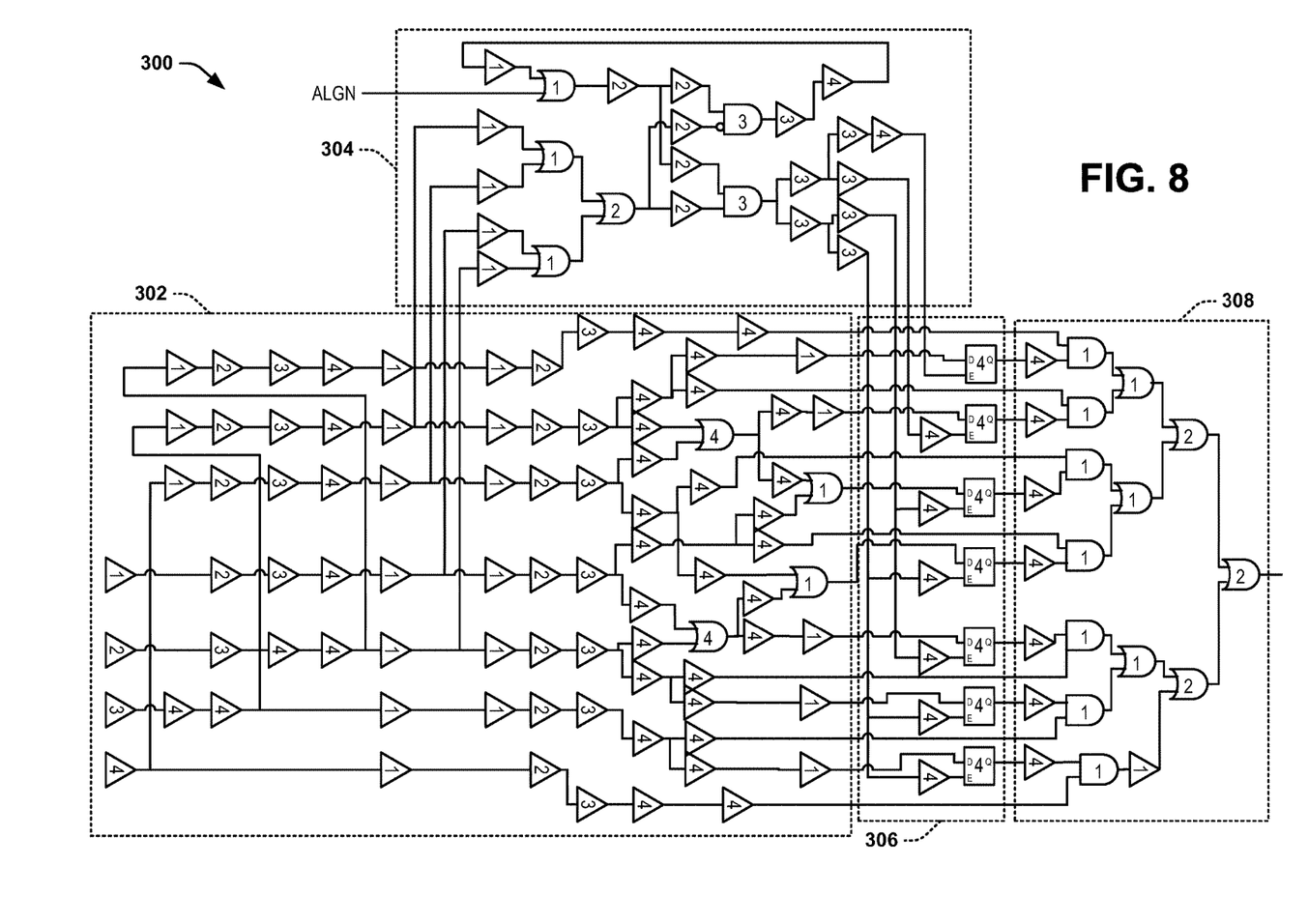
FIG. 8 illustrates yet another example of digital logic.

FIGS. 6-8 demonstrate three separate examples of the digital logic 106, such that each corresponds to the diagram 150 in the example of FIG. 5. Particularly, FIG. 6 illustrates an example of digital logic 200 that includes an alignment logic stage 202, a control logic stage 204, a waveform analysis logic stage 206, and a selector logic stage 208. FIG. 7 illustrates another example of digital logic 250 that includes an alignment logic stage 252, a control logic stage 254, a waveform analysis logic stage 256, and a selector logic stage 258. FIG. 8 illustrates yet another example of digital logic 300 that includes an alignment logic stage 302, a control logic stage 304, a waveform analysis logic stage 306, and a selector logic stage 308. In the examples of FIGS. 6-8, each of the buffers demonstrated correspond to JTLs that are clocked based on a given phase of the AC clock signal CLK, numbered 1, 2, 3, and 4 (e.g., corresponding to 0°, 90°, 180°, and 270°, respectively). Similarly, logic-OR gates, logic-AND gates, and D-latches are likewise clocked based on the respective phases of the AC clock signal CLK, numbered 1, 2, 3, and 4.

Similar to as described previously, and submitted as an example, an individual isochronous receiver system 14 is expected to have a nominal window of about 145° with a range of between approximately 135° at worst case and approximately 155° best case. This is thus a nominal overlap of 145−90=55° for N=4 in the case of an AC clock signal CLK that corresponds to using each of two sinusoidal clocks in a quadrature relationship with both possible directional windings. Allowing for 5° of potential mismatch between the in-phase and quadrature-phase components combined with the best case and worst case window ranges, an overlap of between 40° and 70° is established depending on fabrication tolerances and system performance. For K=1 (e.g., the transmitter sending a single data bit every clock cycle), when a single pulse PLS is transmitted across the transmission line 16, the converter system 100 receives the single pulse in one or two of the four SFQ-RQL converters 104 (e.g., M=MAX−1=2−1=1).

In the example of the digital logic 200 in the example of FIG. 6, the digital logic 200 has NK=4 delayed RQL phase signals provided to the control logic stage 204 and NK+M=5 delayed RQL phase signals being provided to the waveform analysis logic stage 206. In the digital logic 200, no widening is performed, so the selector logic stage 208 also receives the same NK+M=5 delayed RQL phase signals. So the control logic stage 204 receives four delayed RQL phase signals and the waveform analysis logic stage 206 and selector logic stage 208 each receive five RQL phase signals (e.g., with one of the five RQL phase signals corresponding to a splitting of one of the RQL phase signals in the alignment logic stage 202). The waveform analysis logic stage 206 latches which of the five bits are a logic-1 when the control logic stage 204 detects a logic-1 in any of the four received bits in response to the alignment signal ALGN. The extra bit (e.g., number 1) is provided to the waveform analysis logic stage 206 to cover the example where the control logic stage 204 could receive an RQL phase signal that is straddled between two sequential delay paths corresponding to sequential sampling times of the AC clock signal CLK. Thus, in the digital logic 200, the maximum drift of uncertainty occurs when the RQL phase signal is caught in only one delay path but is close to crossing the window where it could be provided in two delay paths. Thus, the digital logic 200 can have a minimum amount of overlap of approximately 40° as a margin. At approximately 10 GHz (e.g., the frequency of the AC clock signal CLK), the 40° margin thus corresponds to approximately 11.11 ps.

In the example of FIG. 7, the digital logic 250 can be implemented to better accommodate a case where the RQL phase signal is received in one delay path, and can thus widen the window of when the RQL phase signal is received in the one delay path. In the example of the RQL phase signal being provided in two delay paths, the maximum drift uncertainty can occur when the RQL phase signal is just about to transition back to only being received in one delay path corresponding to the minimum clock difference (e.g., 85°). Thus, as an example, at 10 GHz, the 85° margin corresponds to approximately 23.6 ps. The example of FIG. 7 thus provides a significantly better margin. Furthermore, to improve performance, the sampling window can be digitally widened, such that if the signal is only seen in a single delay path, the waveform analysis logic stage 206 can add the two adjacent delay paths to the enable inputs of the D-latches. In the example of FIG. 7, the control logic stage 254 receives two signals corresponding to logic-AND delayed RQL phase signals, and the waveform analysis logic stage 256 and selector logic stage 258 each receive six RQL phase signals (e.g., with two of the six RQL phase signals corresponding to a splitting of two of the RQL phase signals in the alignment logic stage 252). Therefore, when the RQL phase signal is only provided in a single delay path but just about to cross into being provided in two delay paths, the minimum margin is the scenario of when it is provided in the one delay path and just about to cross into the two delay path and the margin is the minimum width window size (e.g., 135°). Thus, as an example, at 10 GHz, the 135° margin corresponds to approximately 37.5 ps, which is a greater margin than when seen in two delay paths, which limits the performance to approximately 23.6 ps of margin.

In the example of FIG. 8, the digital logic 300 can be implemented to widen the window of when the RQL phase signal is received in the one or two delay paths. For example, the digital logic 300 can be implemented to widen from a two delay path scenario to a four delay path scenario corresponding to a different failure mechanism. The RQL phase signal could, in theory, drift far enough that it would be received in two separate clock periods of the AC clock signal CLK. Such a scenario would have the effect of adding an extra logic-1 to every sequence of logic-1s, which would not correctly recover the signal to provide the RQL output signal $RQL_{OUT}$. Such a failure can occur when an RQL phase signal is received in two delay paths and drifts almost 180° and is received in a different set of two delay paths. In the example of FIG. 8, the control logic stage 304 receives four delayed RQL phase signals, and the waveform analysis logic stage 306 and selector logic stage 308 each receive seven RQL phase signals (e.g., with three of the seven RQL phase signals corresponding to a splitting of three of the RQL phase signals in the alignment logic stage 302). The margin available in this scenario is 180° minus the maximum overlap (e.g., 70°), and thus approximately 110°. Thus, as an example, at 10 GHz, the 110° margin corresponds to approximately 30.5 ps. Thus, unlike previous drift scenarios that are limited by the worst case window width, in this example, the best case window width limits performance. As a result, further widening of the sampling window may not improve performance.

Therefore, the examples of FIGS. 6-8 demonstrate examples of digital logic 106 that can be implemented to provide the RQL phase signals as a single RQL output signal $RQL_{OUT}$ that is aligned to a predetermined sampling phase of the AC clock signal CLK (e.g., the 90° phase of the AC clock signal CLK in the example of FIGS. 6-8). The diagrams 200, 250, and 300 are provided as examples, such that the digital logic 106 can be provided in any of a variety of ways to align the RQL phase signals as a single RQL output signal $RQL_{OUT}$ with respect to the AC clock signal CLK.

Figure 9:
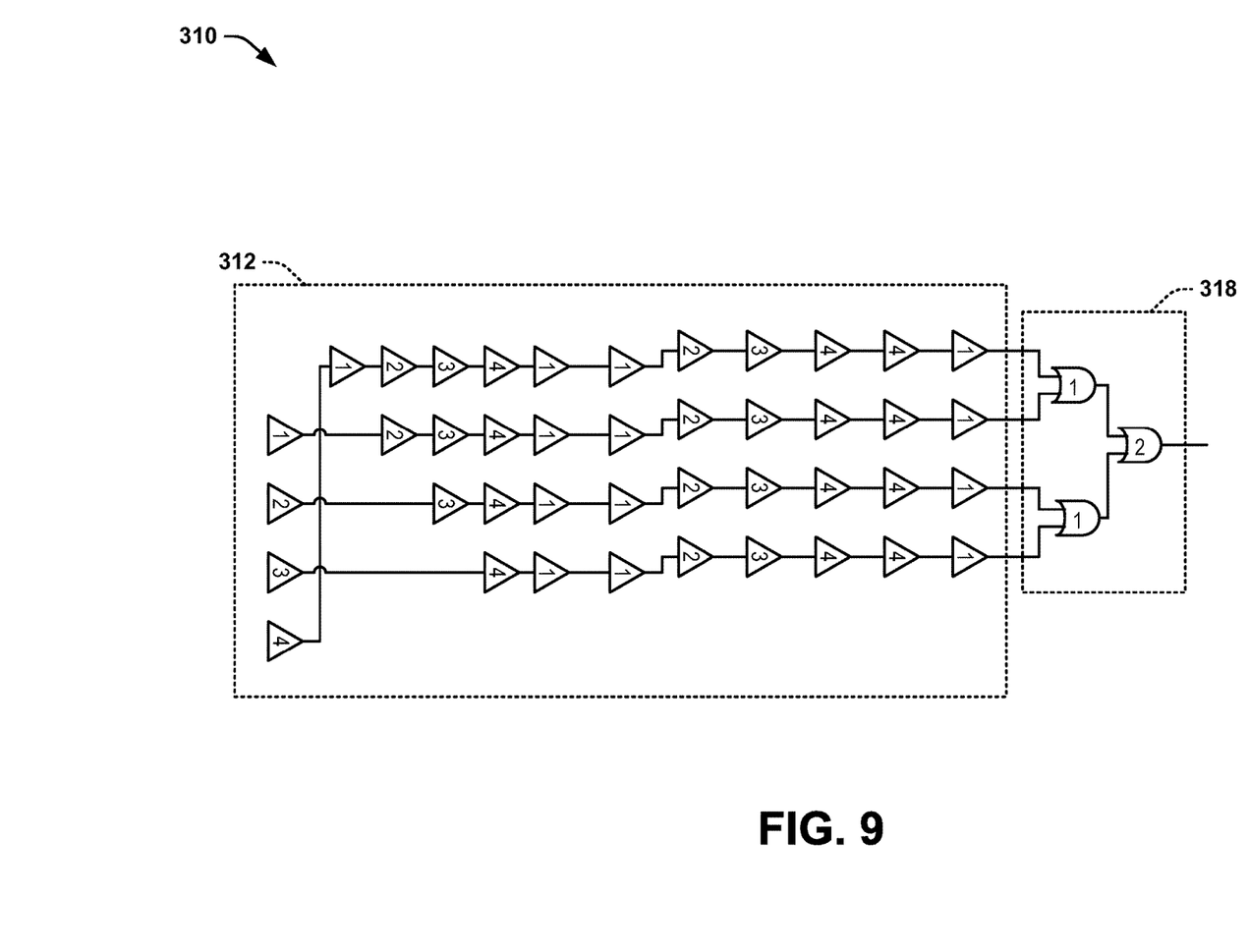
FIG. 9 illustrates yet a further example of digital logic.

In some applications, the AC clock signal CLK may have a known phase skew between the transmitter and receiver. In the event of a known phase skew, the digital logic 106 can be greatly simplified. To some extent, this can correspond to a synchronous system, and there may still be a need to offer a wider receive window than available with a single RQL receiver. For example, the digital logic 106 can be hardwired to provide the alignment of the RQL phase signals to the AC clock signal CLK, as opposed to the alignment being based on the alignment signal ALGN. FIG. 9 illustrates yet a further example of digital logic 310. The digital logic 310 demonstrates an example of hardwired alignment of the RQL phase signals to the AC clock signal CLK without the alignment signal ALGN. In the example of FIG. 9, the digital logic 310 includes only an alignment logic stage 312 that includes four delay paths and a selector logic stage 318. Therefore, as opposed to the digital logic 150, 200, 250, and 300, the control logic stage 154 and the waveform analysis logic stage 156 are eliminated in the digital logic 310. In the example of FIG. 9, the selector logic stage 318 includes a sequence of OR-gates to provide the RQL output signal $RQL_{OUT}$. However, other arrangements of logic gates can be implemented instead. Therefore, the RQL phase signals can be hardwire-aligned to the AC clock signal CLK, and thus absent an external alignment signal ALGN.

Other examples of hardwired implementation are likewise possible. For example, the waveform logic stage 156 can be configured as a circuit driving up to N (the oversampling rate) of the respective latches with constant logic-ones, and the other latches with constant logic-zeroes. Additional logic could thus also be eliminated based on the constant propagation. Therefore, the number of SFQ-RQL converters 104 could equal the number of latches replaced with constant logic-ones, such that the digital logic 106 can just be configured as a set of JTLs and OR-gates. Accordingly, the digital logic 106 can be configured in a variety of different ways. The width of the third delayed set of the RQL phase signals $DLY_3$ for hardwired implementations is reduced to at most one copy of each of the SFQ-RQL converters 104. The SFQ splitter stage 102 may have up to N outputs, and the receiver system 100 can include up to N SFQ-RQL converters 104.

Figure 10:
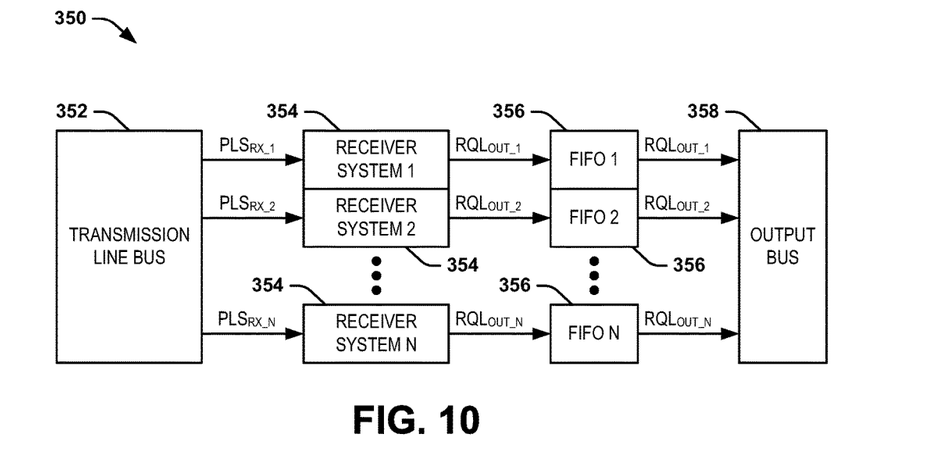
FIG. 10 illustrates an example of an isochronous bus receiver system.

FIG. 10 illustrates an example of an isochronous bus receiver system 350. The isochronous bus receiver system 350 can correspond to a receiver system that is configured to receive a plurality of pulse signals PLS across a transmission line bus 352 that includes respective transmission lines. In the example of FIG. 10, the isochronous bus receiver system 350 includes a plurality N of receiver systems 354 that are configured to respectively receive a plurality N of pulse signals from the transmission line bus 352, demonstrated as pulse signals $PLS_{RX\_1}$ through $PLS_{RX\_N}$, from respective transmission lines associated with the transmission line bus 352, where N is a positive integer greater than one. As an example, each of the receiver systems 354 can be configured substantially the same as the receiver system 14 in the example of FIG. 1. Therefore, each of the receiver systems 354 can include an SFQ splitter 106, a plurality (e.g., four) of SFQ-RQL converters 104, and digital logic 106. Accordingly, each of the receiver systems 354 is configured to generate a respective RQL output signal data stream, demonstrated in the example of FIG. 10 as RQL output signals $RQL_{OUT\_1}$ through $RQL_{OUT\_N}$.

In addition, the isochronous bus receiver system 350 includes a respective plurality N of first-in-first-out (FIFO) registers 356. Each of the FIFO registers 356 is configured to receive a respective one of the RQL output signals $RQL_{OUT\_1}$ through $RQL_{OUT\_N}$. The RQL output signals $RQL_{OUT\_1}$ through $RQL_{OUT\_N}$ can be shift-controlled through the respective FIFO registers (e.g., individually), such that the RQL output signals $RQL_{OUT\_1}$ through $RQL_{OUT\_N}$ can be aligned with respect to each other (e.g., based on the AC clock signal CLK that is associated with the isochronous bus receiver system 350). Thus, the RQL output signals $RQL_{OUT\_1}$ through $RQL_{OUT\_N}$ can be provided on an output bus 358 to additional downstream RQL circuitry. As an example, each of the FIFO registers 356 can be very small (e.g., two to four bits). Thus, one way to align the RQL output signals $RQL_{OUT\_1}$ through $RQL_{OUT\_N}$ on the output bus 358 is write the respective RQL output signals $RQL_{OUT\_1}$ through $RQL_{OUT\_N}$ to the respective FIFO registers 356 after they are respectively aligned via the receiver systems 354, and to begin reading the RQL output signals $RQL_{OUT\_1}$ through $RQL_{OUT\_N}$ in parallel when each of the FIFO registers 356 include data (e.g., are no longer empty). Accordingly, the RQL output signals $RQL_{OUT\_1}$ through $RQL_{OUT\_N}$ can thus be aligned across the output bus 358.

Figure 11:
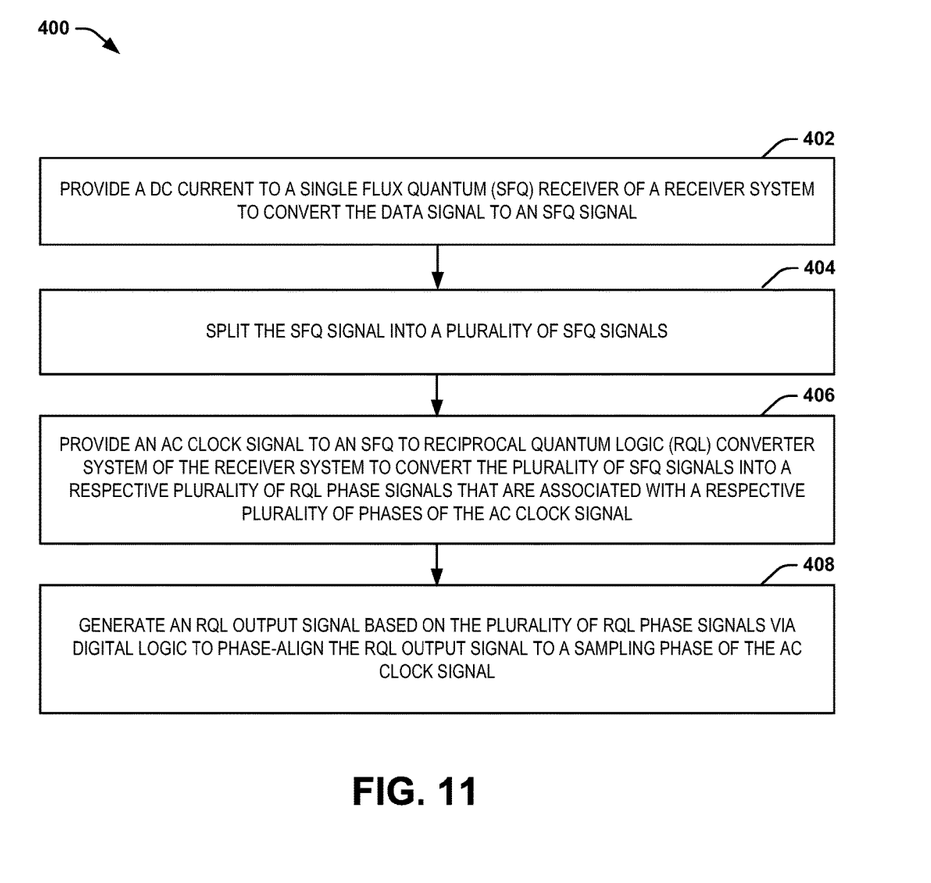
FIG. 11 illustrates an example of a method for isochronously receiving a data signal from a transmission line.

In view of the foregoing structural and functional features described above, a method in accordance with various aspects of the present disclosure will be better appreciated with reference to FIG. 11. While, for purposes of simplicity of explanation, the method of FIG. 11 is shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a method in accordance with an aspect of the present disclosure.

FIG. 11 illustrates a method 400 for isochronously receiving a data signal (e.g., the pulse signal PLS) from a transmission line (e.g., the transmission line 16). At 402, a DC current (e.g., the DC current $I_{DC}$) is provided to an SFQ receiver (e.g., the SFQ receiver 22) of a receiver system (e.g., the receiver system 14) to convert the data signal to an SFQ signal (e.g., the SFQ signal $SFQ_{RX}$). At 404, the SFQ signal is split into a plurality of SFQ signals (e.g., the SFQ signals $SFQ_1$, $SFQ_2$, $SFQ_3$, $SFQ_4$). At 406, an AC clock signal (e.g., the AC clock signal CLK) is provided to a converter system (e.g., the converter system 24) of the receiver system to convert the plurality of SFQ signals into a respective plurality of RQL phase signals (e.g., the RQL phase signals $RQL_0$, $RQL_{90}$, $RQL_{180}$, $RQL_{270}$) that are associated with a respective plurality of phases of the AC clock signal. At 408, an RQL output signal (e.g., the RQL output signal $RQL_{OUT}$) is generated based on the plurality of RQL phase signals via digital logic (e.g., the digital logic 106) to phase-align the RQL output signal to a sampling phase of the AC clock signal.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. An isochronous receiver system comprising:
   a single flux quantum (SFQ) receiver configured to receive a data signal from a transmission line and to convert the data signal to an SFQ signal; and
   a converter system configured to convert the SFQ signal to a reciprocal quantum logic (RQL) signal and to phase-align the RQL signal with a sampling phase of an AC clock signal.

2. The system of claim 1, wherein the converter system comprises:
   an SFQ splitter stage configured to split the SFQ signal into a plurality of SFQ signals;
   a plurality of SFQ-RQL converters that are configured to sample the plurality of SFQ signals at each of a separate respective phase of the AC clock signal to generate a respective plurality of RQL phase signals; and
   digital logic configured to generate an RQL output signal that is aligned with the sampling phase of the AC clock signal based on the plurality of RQL phase signals.

3. The system of claim 2, wherein the digital logic comprises:
   an alignment logic stage configured to phase-align and delay each of the plurality of RQL phase signals; and
   a selector logic stage configured to align the at least one RQL pulse to the sampling phase of the AC clock signal to provide the RQL output signal.

4. The system of claim 3, wherein the alignment logic stage comprises a plurality of Josephson transmission line (JTL) delay elements configured to phase-align and delay each of the plurality of RQL phase signals and to split the plurality of delayed RQL phase signals into at least one set of delayed RQL phase signals.

5. The system of claim 4, wherein the plurality of JTL delay elements are arranged in each of a plurality of delay paths, wherein the alignment logic stage comprises a plurality of delay paths that is greater than the plurality of RQL phase signals based on splitting each of at least one of the plurality of RQL phase signals into more than one of the plurality of delay paths, such that the plurality of delay paths are each associated with a respective phase of single period of the AC clock signal and at least one phase of a portion of a next period of the AC clock signal.

6. The system of claim 5, wherein the plurality of delay paths are configured to propagate a plurality of RQL pulses associated with a single bit of data on each of a respective set of delay paths of the plurality of delay paths that are sequential in phase relationship based on the plurality of SFQ pulses arriving at the respective plurality of SFQ-RQL converters in a phase window between the phases of the AC clock signal associated with the respective plurality of delay paths that are sequential in phase relationship.

7. The system of claim 6, wherein the digital logic is configured to provide phase-alignment of the RQL output signal with respect to the single bit of data being provided on a sequential pair of the plurality of delay paths that are sequential in phase relationship with respect to the AC clock signal, or to provide phase-alignment of the RQL output signal with respect to the single bit of data drifting to one of a next or previous one of the plurality of delay paths that are sequential in phase relationship with respect to the AC clock signal.

8. The system of claim 3, further comprising:
a control logic stage configured to receive an alignment signal and to generate at least one trigger signal in response to the alignment signal and at least one RQL pulse associated with a respective at least one of the respective plurality of delayed RQL phase signals; and
a waveform analysis logic stage configured to latch the at least one RQL pulse in response to the at least one trigger signal.

9. The system of claim 8, wherein the waveform analysis logic stage comprises a plurality of latches configured to latch at least one RQL pulse associated with a set of delayed RQL phase signals in response to the at least one trigger signal.

10. The system of claim 8, wherein the selector logic stage comprises a plurality of selector logic gates configured to provide sequential logic operations on the at least one latched RQL pulse and a set of delayed RQL phase signals to generate the RQL output signal that is aligned to the sampling phase of the AC clock signal.

11. The system of claim 1, wherein the isochronous receiver system is a first isochronous receiver system of a plurality of isochronous receiver systems configured to generate a plurality of RQL output signals on a bus, the isochronous receiver system further comprising a respective plurality of first-in-first-out (FIFO) buffers configured to phase-align the plurality of RQL output signals on the bus.

12. An RQL inter-chip transmission system comprising the isochronous receiver system of claim 1, the RQL inter-chip transmission system further comprising:
a transmitter system configured to convert an RQL input signal into the data signal; and
the transmission line to transmit the data signal to the isochronous receiver system.

13. A method for isochronously receiving a data signal from a transmission line, the method comprising:
providing a DC current to a single flux quantum (SFQ) receiver of a receiver system to convert the data signal to an SFQ signal;
splitting the SFQ signal into a plurality of SFQ signals;
providing an AC clock signal to an SFQ to reciprocal quantum logic (RQL) converter system of the receiver system to convert the plurality of SFQ signals into a respective plurality of RQL phase signals that are associated with a respective plurality of phases of the AC clock signal; and
generating an RQL output signal based on the plurality of RQL phase signals via digital logic to phase-align the RQL output signal to a sampling phase of the AC clock signal.

14. The method of claim 13, wherein generating the RQL output signal comprises:
phase-aligning and delaying each of the plurality of RQL phase signals via a plurality of plurality of Josephson transmission line (JTL) delay elements;
generating at least one trigger signal in response to an alignment signal and at least one RQL pulse associated with a respective at least one of the respective plurality of delayed RQL phase signals;
latching the at least one RQL pulse in response to the at least one trigger signal; and
aligning the at least one RQL pulse to the sampling phase of the AC clock signal to provide the RQL output signal.

15. The method of claim 14, wherein phase-aligning and delaying each of the plurality of RQL phase signals comprises phase-aligning and delaying each of the plurality of RQL phase signals in each of a respective plurality of delay paths, the method further comprising splitting at least one of the plurality of RQL phase signals into more than one of the plurality of delay paths, such that the plurality of delay paths are each associated with a respective phase of single period of the AC clock signal and at least one phase of a portion of a next period of the AC clock signal.

16. The method of claim 14, further comprising splitting the plurality of delayed RQL phase signals into a first set of delayed RQL phase signals, a second set of delayed RQL phase signals, and a third set of delayed RQL phase signals;
wherein generating the at least one trigger signal comprises generating the at least one trigger signal based on the alignment signal and the first set of delayed RQL phase signals;
wherein latching the at least one RQL pulse comprises latching the at least one RQL pulse in response to the at least one trigger signal and the second set of delayed RQL phase signals; and
wherein aligning the at least one RQL pulse comprises providing sequential logic operations on the at least one latched RQL pulse and the third set of delayed RQL phase signals to generate the RQL output signal that is aligned to the sampling phase of the AC clock signal.

17. An isochronous superconducting inter-chip transmission system comprising:
a transmitter system configured to convert an RQL input signal into the data signal;
transmission line to transmit the data signal from the transmitter system; and
an isochronous receiver system comprising:
a single flux quantum (SFQ) receiver configured to receive the data signal from the transmission line and to convert the data signal to an SFQ signal; and
a converter system configured to convert the SFQ signal to a reciprocal quantum logic (RQL) signal and to phase-align the RQL signal with a sampling phase of an AC clock signal.

18. The system of claim 17, wherein the converter system comprises:
an SFQ splitter stage configured to split the SFQ signal into a plurality of SFQ signals;
a plurality of SFQ-RQL converters that are configured to sample the plurality of SFQ signals at each of a separate respective phase of the AC clock signal to generate a respective plurality of RQL phase signals; and digital logic configured to generate an RQL output signal that is aligned with the sampling phase of the AC clock signal based on the plurality of RQL phase signals.

19. The system of claim 18, wherein the digital logic comprises:
an alignment logic stage configured to phase-align and delay each of the plurality of RQL phase signals;
a control logic stage configured to receive an alignment signal and to generate at least one trigger signal in response to the alignment signal and at least one RQL pulse associated with a respective at least one of the respective plurality of delayed RQL phase signals;
a waveform analysis logic stage configured to latch the at least one RQL pulse in response to the at least one trigger signal; and
a selector logic stage configured to align the at least one RQL pulse to the sampling phase of the AC clock signal to provide the RQL output signal.

20. The system of claim 19, wherein the alignment logic stage comprises a plurality of Josephson transmission line (JTL) delay elements configured to phase-align and delay each of the plurality of RQL phase signals and to split the plurality of delayed RQL phase signals into a first set of delayed RQL phase signals that is provided to the control logic stage, a second set of delayed RQL phase signals that is provided to the waveform analysis stage, and a third set of delayed RQL phase signals that is provided to the selector logic stage.

* * * * *

UNITED STATES PATENT AND TRADEMARK OFFICE
CERTIFICATE OF CORRECTION

PATENT NO. : 9,876,505 B1  
APPLICATION NO. : 15/256213  
DATED : January 23, 2018  
INVENTOR(S) : Dai et al.

Page 1 of 2

It is certified that error appears in the above-identified patent and that said Letters Patent is hereby corrected as shown below:

In the Drawings

Please replace FIG. 4 with FIG. 4 as shown on the attached page.

In the Specification

The sentence beginning at Column 6, Line 20, should read as follows:
The first input JTL stage 122 includes an input inductor $L_1$ through which the SFQ pulse SFQN propagates and a first Josephson junction $J_1$ that is triggered in response to the SFQ pulse SFQN based on a bias signal $CLK_Y$ generated via a current source 128.

The sentence beginning at Column 6, Line 24, should read as follows:
The current $CLK_Y$ flows through a first bias inductor $L_{BIAS1}$ to bias the first Josephson junction $J_1$ and a second Josephson junction $J_2$ via respective inductors $L_2$ and $L_3$, such that the SFQ pulse SFQN propagates through the inductors $L_2$ and $L_3$ in response to the first Josephson junction $J_1$ triggering, to subsequently trigger the Josephson junction $J_2$ to provide the SFQ pulse SFQN to the output driver stage 126 via an inductor $L_4$.

The sentence beginning at Column 6, Line 35, should read as follows:
Particularly, the second input JTL stage 124 includes a pair of Josephson junctions $J_3$ and $J_4$ that are arranged opposite each other with respect to a bias signal $CLK_Y$ generated via a current source 130 (e.g., from the same current source 128) through a second bias inductor $L_{BIAS2}$ and through inductors $L_5$ and $L_6$.

The sentence beginning at Column 6, Line 55, should read as follows:
However, the bias current source 132 is configured as an AC current source that is associated with a particular respective sampling phase associated with the AC clock signal CLK (e.g., from the same current source 128).

Signed and Sealed this  
Twenty-seventh Day of August, 2019

Andrei Iancu  
*Director of the United States Patent and Trademark Office*

FIG. 4